(12) United States Patent
Midorikawa

(10) Patent No.: US 6,360,559 B1
(45) Date of Patent: Mar. 26, 2002

(54) COOLING SYSTEM

(75) Inventor: Jun Midorikawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/586,532

(22) Filed: May 31, 2000

(30) Foreign Application Priority Data

Jun. 2, 1999 (JP) ............................................ 11-155042

(51) Int. Cl.[7] ............................ F25B 43/04; F28D 15/00
(52) U.S. Cl. .................. 62/475; 62/259.2; 165/104.33; 361/689
(58) Field of Search ................ 62/475, 474, 259.2, 62/512, 529; 210/295, 296, 287; 165/104.33; 361/688, 689, 699, 676

(56) References Cited

U.S. PATENT DOCUMENTS 4,141,224 A * 2/1979 Alger et al.
4,437,082 A 3/1984 Walsh et al. .................. 336/58
4,897,762 A * 1/1990 Daikoku et al.

FOREIGN PATENT DOCUMENTS

| DE | 734633  | 4/1943  |
| DE | 72828   | 11/1969 |
| DE | 118193  | 6/1975  |
| DE | 4033172 | 10/1990 |
| DE | 4008486 | 9/1991  |
| EP | 0524757 | 1/1993  |

* cited by examiner

Primary Examiner—Henry Bennett
Assistant Examiner—Chen-Wen Jiang
(74) Attorney, Agent, or Firm—David N. Lathrop, Esq.; Gallagher & Lathrop

(57) ABSTRACT

In a cooling system for suppressing a temperature rise in a component being cooled by circulating coolant through the component, a moisture eliminating filter is located so as to cover a coolant outlet of a coolant storage tank disposed in the coolant circulating circuit so that the coolant has moisture removed by the moisture eliminating filter before it is supplied to the component being cooled.

9 Claims, 4 Drawing Sheets

COOLING SYSTEM

BACKGROUND OF THE INVENTION

1. Field of the Invention

This invention relates to a cooling system for cooling a heat-generating element in electronic equipment, for example, and particularly to such system designed for enhancement of the rate of moisture adsorption as well as downsizing of the system.

2. The Prior Art

FIG. 1 illustrates the configuration of a cooling system which may be conceived from the prior art. By way of example, a component 10 being cooled may be a heat-generating semiconductor integrated circuit element mounted on a printed-circuit board and covered by a water jacket cover into and through which cooling liquid or coolant J is passed to cool the heat-generating element.

The component 10 being cooled is chilled by the coolant supplied by a coolant circulating system 20. In the coolant circulating system 20, the coolant J from a coolant storage tank 22 is supplied by a pump 23 into a moisture eliminating filter 24 from where the coolant having moisture removed therefrom is passed through a supply piping 27 having a moisture detecting sensor 25 disposed therein into a water jacket cover (not shown) around the component 10 being cooled. The coolant having flowed through the jacket cover is then passed through a return piping 26 back to the coolant circulating system 20 where it is chilled through a heat exchanger 21 prior to being returned to the coolant storage tank 22. The moisture detecting sensor 25 comprises a pair of electrodes disposed in the piping 27, the arrangement being such that upon moisture depositing between the pair of electrodes, a contact signal will be generated.

The heat exchanger 21, coolant storage tank 22, pump 23, moisture eliminating filter 24 and moisture detecting sensor 25 are successively connected by the pipings 26 and 27 to constitute a circulating fluid circuit. Through this fluid circuit is circulated an insulating coolant such as perfluorocarbon so that the heat produced in the component 10 being cooled is dissipated through the heat exchanger 21 to the atmosphere to thereby suppress a rise in temperature in the component 10.

Where the component 10 being cooled is a semiconductor integrated circuit element as exemplified above, the cooling liquid is flowed in direct contact with the semiconductor integrated circuit element. It is for this reason that the coolant must be an insulating coolant. Should moisture be entrained in the coolant, the moisture would possibly create the risk of an accidental short-circuit between the terminals of the semiconductor integrated circuit element.

In order to avoid such situation, it is conceivable to dispose the moisture eliminating filter 24 which may comprise zeolite-based adsorbent, for example in the coolant circulating circuit so that any moisture entrained in the coolant may be adsorbed by the moisture eliminating filter 24 to prevent ingress of moisture into the component 10 being cooled. In addition, it is preferable that the moisture detecting sensor 25 be located adjacent the coolant inlet to the component 10 through which the coolant from the circulating circuit is introduced into the component 10 and that a function be added for generating an alarm to indicate instantly when any moisture is trapped in the coolant before flowing into the component 10.

As discussed above, since the moisture eliminating filter 24 is for eliminating moisture contained in the coolant, all of the coolant to be supplied to the component 10 being cooled must be passed through the moisture eliminating filter 24.

In general, since the moisture eliminating filter 24 is contained in a relatively small-sized filter housing 24A, the filter is correspondingly small in size. While it is depicted in an exaggerated size in FIG. 1 for the benefit of illustrating the construction, the volume of the filter housing 24A is actually on the order of one-tenth of that of the coolant storage tank 22. The moisture eliminating filter 24 which is generally cylindrical in shape is configured such that as the coolant is introduced into the filter 24 via one end thereof and passed therethrough and exuded therefrom into the interior of the filter housing 24A, the moisture in the coolant is adsorbed by the filter. Flowing a large amount of coolant through the small-sized moisture eliminating filter 24 necessitates a higher flow rate, resulting undesirably in reducing the rate of moisture adsorption. In addition, an increase in the flow rate creates a greater pressure loss across the moisture eliminating filter 24, which in turn requires a larger capacity pump.

Furthermore, disposing the moisture eliminating filter 24 and the moisture detecting sensor 25 independently from each other in the circulating circuit imposes the disadvantage of oversizing the entire coolant circulating system 20.

Accordingly, it is an object of this invention to provide a cooling system which provides for downsizing of the system.

It is another object of this invention to provide a cooling system which allows for enhancing the rate of moisture adsorption.

SUMMARY OF THE INVENTION

According to this invention, the moisture eliminating filter is contained in the coolant storage tank. Specifically, the moisture eliminating filter is disposed in the coolant storage tank such that it covers an outlet from the tank. In an alternate embodiment, the moisture eliminating filter is located in the coolant storage tank with its outer periphery in contact with the inner periphery of the coolant storage tank.

It will thus be appreciated that this construction eliminates the need for provision of an outer filter housing, leading to downsizing of the system. Additionally, the coolant storage tank is increased in volume, which allows for a relatively lower flow rate of coolant as well as increasing the volume of the moisture eliminating filter, whereby the rate of moisture adsorption may be improved. It is thus to be understood that this construction introduces the additional advantage of providing a highly stable cooling system which does not permit moisture to migrate into a component being cooled.

Moreover, if the moisture detecting sensor is also disposed in the coolant storage tank, it contributes to further downsizing of the system.

BRIEF DESCRIPTION OF THE DRAWINGS

FIG. 3B 1 is a cross-sectional view illustrating still another form of the coolant storage tank.

DETAILED DESCRIPTION OF THE PREFERRED EMBODIMENTS

Figure 1:
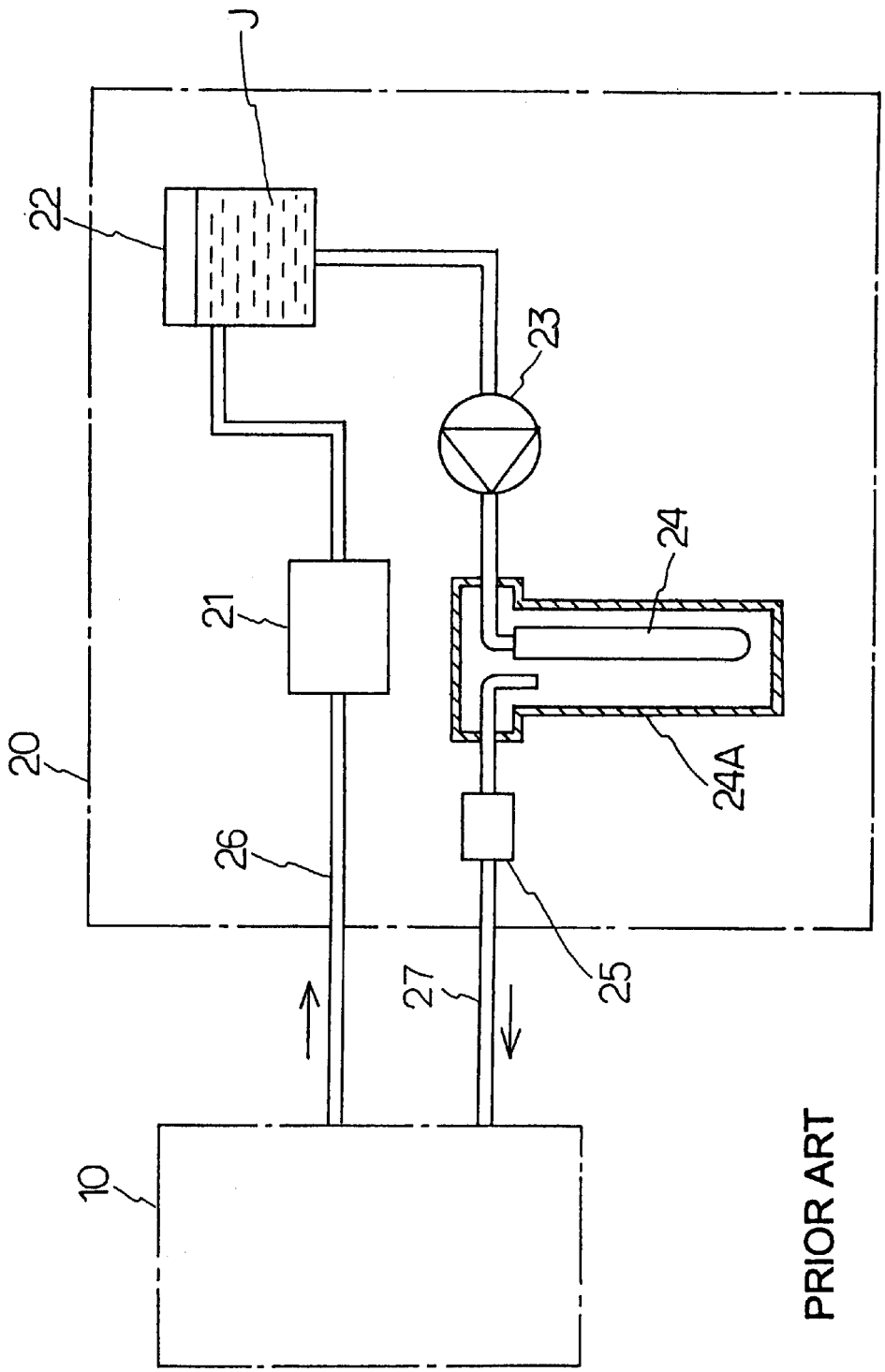
FIG. 1 is an illustration showing the configuration of the cooling system conceivable from the prior art.
Figure 2:
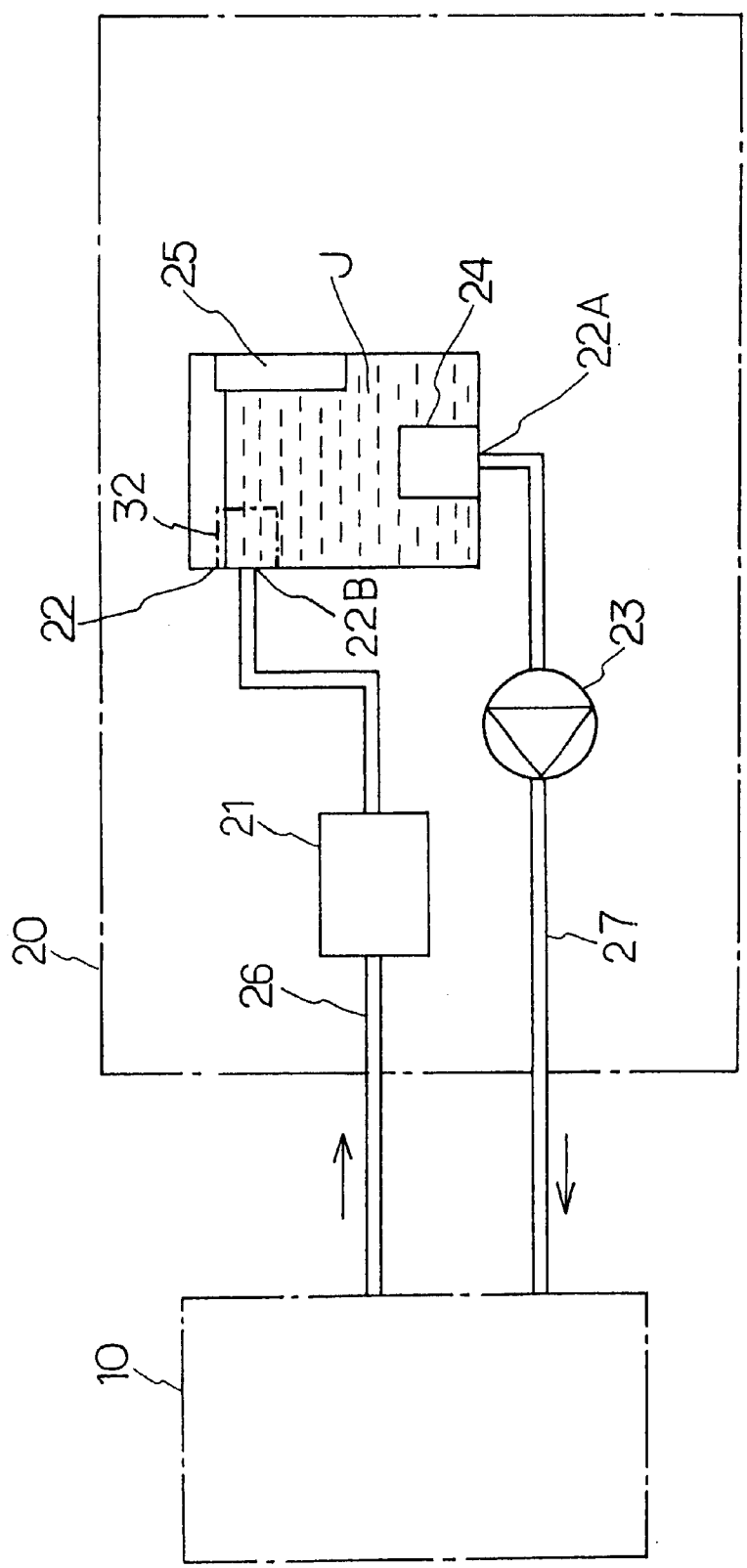
FIG. 2 is an illustration showing the configuration of one embodiment of the cooling system according to this invention.

FIG. 2 illustrates one embodiment this invention in which those elements corresponding to those shown in FIG. 1 are indicated by like reference numerals. In this embodiment, the moisture detecting sensor 25 and the moisture eliminating filter or moisture adsorbing filter 24 are contained in the coolant storage tank 22 such that the any moisture entrained in the coolant is removed by the moisture eliminating filter 24 before it is discharged from the coolant storage tank 22.

The embodiment illustrated in FIG. 2 is an instance in which the moisture eliminating filter 24 is disposed over and in contact with a coolant outlet 22A formed in the bottom wall of the coolant storage tank 22 while the moisture detecting sensor 25 is mounted near the surface of the coolant liquid in the coolant storage tank 22. The moisture eliminating filter 24 may be in the form of a column and be vertically mounted on the bottom wall of the coolant storage tank 22 with its central line generally aligned with the center of the coolant outlet 22A.

The coolant is drawn from the coolant storage tank 22 by the pump 23 and is supplied through the piping 27 to the component 10 being cooled. It is to be noted that with the moisture eliminating filter 24 disposed in contact with the coolant outlet 22A of the coolant storage tank 20, the coolant J is always passed through the moisture eliminating filter 24 before it is discharged out through the coolant outlet 22A. As also described above in the background of the invention, the moisture eliminating filter 24 may comprise zeolite-based adsorbent, for example so that moisture, if any, entrained in the coolant J is adsorbed by the moisture eliminating filter 24.

The arrangement in which the moisture eliminating filter 24 is disposed within the interior of the coolant storage tank 20 allows for enlarging the size of the moisture eliminating filter 24. In other words, this construction permits the filter to have an increased surface area for contact with the coolant J, which in turn makes it possible to reduce the flow rate of the coolant J drawn into the filter.

Consequently, it is also possible to reduce the flow rate of the coolant J as it is passed through the moisture eliminating filter 24, whereby the rate of moisture adsorption may be enhanced. In addition, the length of path along which the coolant passes or oozes through the moisture eliminating filter 24 may also be lengthened. This also contributes to enhancement of the rate of moisture adsorption.

Moreover, the moisture detecting sensor 25 located near the liquid surface of the coolant J provides for detecting immediately if any dew condensation occurs on the exposed surfaces of the inner wall of the coolant storage tank 22.

More specifically, should the outside air enter the interior of the coolant storage tank 22 through the poorly sealed tank cover, for example, moisture together with the air would find its way into the tank, resulting possibly in occurrence of dew condensation on the inner wall of the coolant storage tank 22.

Since the coolant is heavier than the water, most of the moisture is highly likely to float on the surface of the coolant J. It is thus to be understood that locating the moisture detecting sensor 25 near the surface of the coolant provides the advantage of detecting any moisture instantly when it floats on the liquid surface in the coolant storage tank 22 and raising an alarm indicating the ingress of moisture.

Figure 3A:
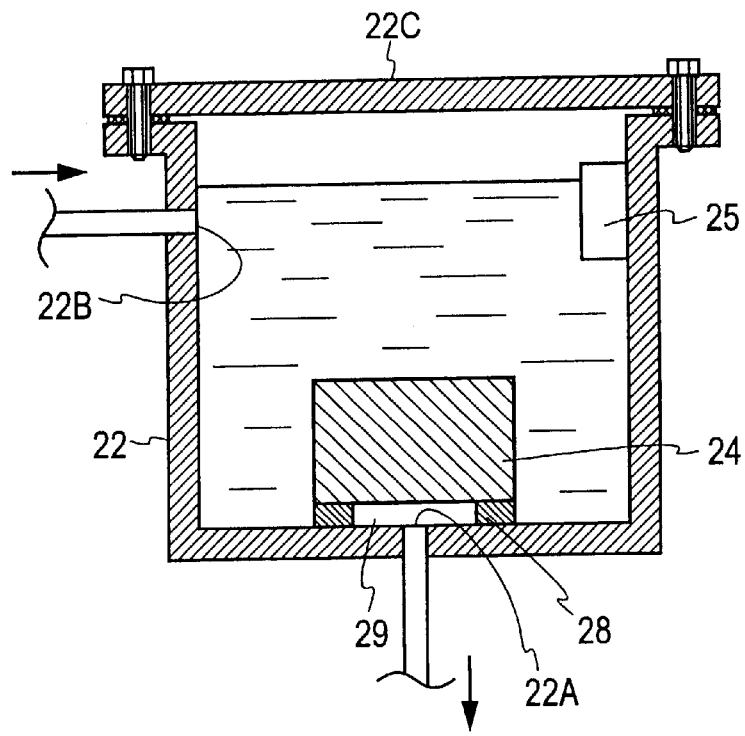
FIG. 3A is a cross-sectional view illustrating another form of the coolant storage tank in the cooling system of this invention.

While the moisture eliminating filter 24 is disposed in contact with the coolant outlet 22A so that the outlet 22A is covered by the moisture eliminating filter 24 in the embodiment described above, the moisture eliminating filter 24 may be mounted on the bottom wall of the coolant storage tank 22 with an annular ring-like spacer 28 interposed between the bottom wall and the lower end of the filter as illustrated in FIG. 3A so as to define space 29 surrounded by the bottom wall of the tank 22, the spacer 28 and the moisture eliminating filter 24. The space 29 is in fluid communication with the coolant outlet 22A and the annular spacer 28 is fluid-tightly sealed to the mating surfaces of the bottom wall of the tank 22 and the moisture eliminating filter 24 to prevent ingress of the coolant into the space 29 through between the mating surfaces so that only the coolant which has passed through the moisture eliminating filter 24 is permitted enter the space 29. With this construction, the coolant which has passed through the moisture eliminating filter 24 is drawn by the pump 23 through that large area of the moisture eliminating filter 24 within the confines of the filter which is not contacted by the space 29, so that the coolant may be drawn more efficiently than in the embodiment shown in FIG. 2.

FIG. 3A also illustrates an instance in which a top cover 22C, for example is removably attached to the open top end of the coolant storage tank 22 so that an access to the interior of the tank may be provided through the same single open location for replacement of the moisture eliminating filter 24, repair and replacement of the moisture detecting sensor 25, and replenishment of the coolant. While the top cover 22C is illustrated as being fixed to the body of the tank by bolts with gaskets interposed therebetween, the means for removably securing the cover 22C may be any other suitable means.

Figure 3B:
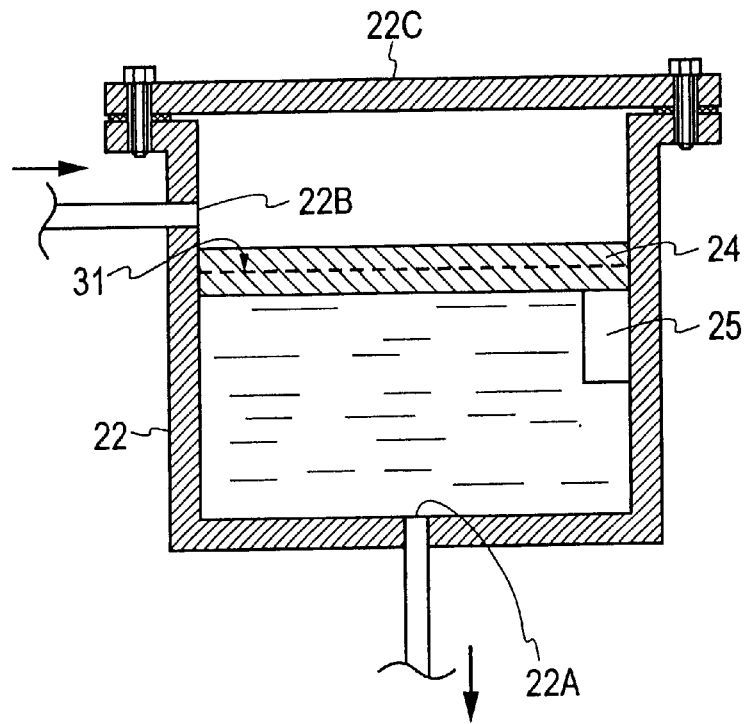

FIG. 3B illustrates still another embodiment of this invention in which the moisture eliminating filter 24 is located near the liquid level 31 of the coolant in the coolant storage tank 22 so as to cover the entire liquid surface with the outer peripheral surface of the moisture eliminating filter 24 being sealed in a fluid-tight manner to the mating inner peripheral surface of the tank 22 to prevent passage of the coolant. In this embodiment as well, any moisture which may have found its way into the coolant is adsorbed by the moisture eliminating filter 24, so that it is only the coolant having the moisture substantially removed therefrom that is discharged out through the coolant outlet 22A.

Figure 4:
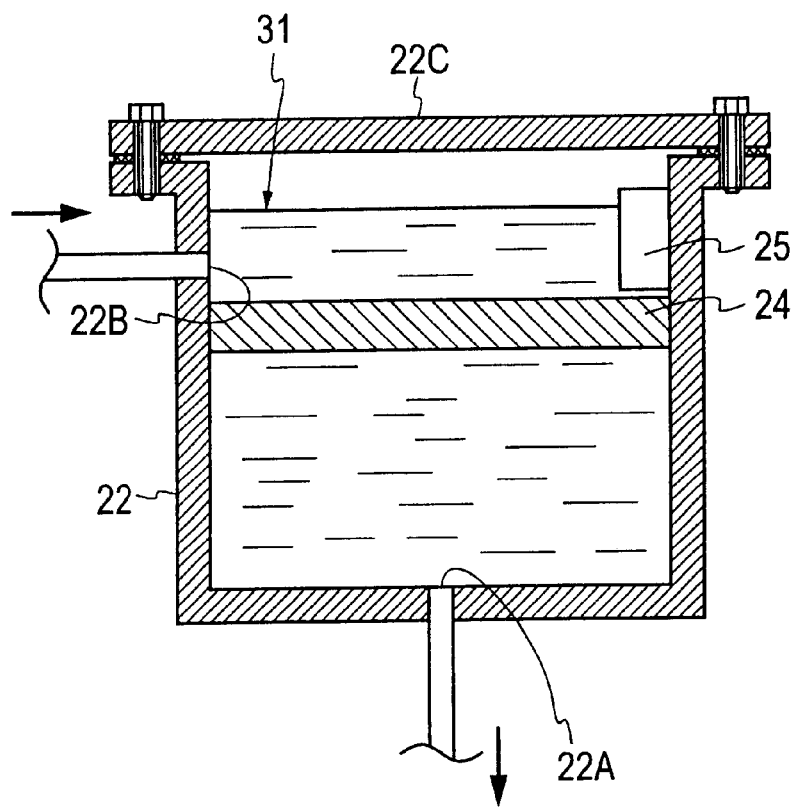
FIG. 4 is a cross-sectional view showing yet another form of the coolant storage tank.

In an alternative embodiment, as illustrated in FIG. 4, the moisture eliminating filter 24 may be located below the liquid level 31 and the coolant inlet 22B with the outer periphery of the filter in contact with the inner periphery of the tank 22. The moisture detecting sensor 25 may be located in the tank near the liquid level 31.

It should also be appreciated that in addition to the moisture eliminating filter 24 a moisture eliminating or absorbing filter 32 may be disposed over and in contact with a coolant inlet 22B to the tank 22 as illustrated in broken lines in FIG. 2 so that any moisture which may have found its way into the coolant as it is passed through a return piping back to the tank may be eliminated.

While the moisture detecting sensor 25 as well as the moisture eliminating filter 24 is contained in the coolant storage tank 22 in the embodiments described herein, it is understood by those skilled in the art that the moisture detecting sensor 25 may be disposed outside of the coolant storage tank 22 in the vicinity of the coolant supply port to the component 10 being cooled as in the example shown in FIG. 1.

As discussed above, the configuration according to this invention in which the moisture eliminating filter 24 is contained in the coolant storage tank 22 provides for downsizing the entire coolant circulating system 20. When the moisture detecting sensor 25 is also contained in the coolant storage tank 22, further downsizing of the coolant circulating system 20 as a whole my be accomplished. In addition, should any moisture enter into coolant storage tank 22 and float on the liquid surface of the coolant J, that condition would be instantly detected by the moisture detecting sensor 25 which may in turn issue an alarm indicating the situation.

Moreover, should any moisture be entrained in the coolant J, it would be only the coolant having the moisture substantially removed therefrom by the moisture eliminating filter 24 in the coolant storage tank 22 that is discharged out through the coolant outlet 22A.

In view of the fact that the moisture eliminating filter 24 is disposed in the coolant storage tank 22 the volume of which may be larger by a factor of 10, for instance than that of the filter housing 24A as shown in FIG. 1, it is understood by those skilled in the art that it is possible to enlarge the surface area of the moisture eliminating filter 24, which in turn makes it possible to reduce the flow rate of the coolant J passing through the moisture eliminating filter 24. As a result, it is also possible to enhance the rate of moisture adsorption to ensure that any moisture which may have found its way into the coolant may be removed.

In addition, since the coolant J is always passed through the moisture eliminating filter 24 before it is discharged from the coolant storage tank 22, it also contributes to enhancement of the rate of moisture adsorption to further ensure moisture removal.

From the foregoing description, it can be seen that the present invention has the advantage of providing a reliable cooling system which is capable of stable operation over an extended period of time.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the embodiments shown and described above, and is intended to encompass all such modifications, alterations, changes, and/or minor improvements falling within the scope of the invention defined by the appended claims.

What is claimed is:

1. A cooling system comprising:
   a coolant storage tank containing coolant therein and having a coolant inlet and coolant outlet;
   a supply piping connected in fluid communication with the coolant outlet of said coolant storage tank for supplying the coolant to a component being cooled;
   a pump disposed in said supply piping for pumping the coolant to said component being cooled;
   a return piping for passing the coolant discharged from said component being cooled back to said coolant storage tank;
   a heat exchanger disposed in said return piping for reducing the temperature of the coolant; and
   a moisture adsorbing filter located in said coolant storage tank for eliminating, before the coolant is withdrawn from said coolant storage tank, any moisture which may have been entrained in the coolant.

2. The cooling system of claim 1 wherein said moisture adsorbing filter is located in said coolant storage tank such that it covers said coolant outlet.

3. The cooling system of claim 2 wherein said moisture adsorbing filter located is located in said coolant storage tank such that the bottom end of the filter is in contact with and covers the bottom wall of said coolant storage tank with the center portion of the bottom end of the filter opposing said coolant outlet.

4. The cooling system of claim 2, further including a ring-like spacer placed on the bottom wall of said coolant storage tank so as to surround said coolant outlet, wherein said moisture adsorbing filter is mounted on said spacer such that said coolant outlet is confined by said spacer and said moisture adsorbing filter.

5. The cooling system of claim 2, further including a moisture detecting sensor located in said coolant storage tank near the liquid level of the coolant in the tank for detecting moisture in said coolant.

6. The cooling system of claim 5, wherein said coolant storage tank has a top cover removably attached thereto so as to facilitate replacement of said moisture adsorbing filter.

7. The cooling system of claim 6, further including a second moisture adsorbing filter disposed in said coolant storage tank so as to cover said coolant inlet.

8. The cooling system of claim 1, wherein said moisture adsorbing filter is located in the coolant storage tank with the outer periphery of the filter in contact with the inner periphery of the coolant storage tank.

9. The cooling system of claim 8, further including a moisture detecting sensor located in said coolant storage tank near the liquid level of the coolant in the tank for detecting moisture in said coolant.

* * * * *